United States Patent
Janardhanan et al.

(10) Patent No.: US 10,505,554 B2
(45) Date of Patent: Dec. 10, 2019

(54) DIGITAL PHASE-LOCKED LOOP

(71) Applicant: TEXAS INSTRUMENTS INCORPORATED, Dallas, TX (US)

(72) Inventors: Jayawardan Janardhanan, Issaquah, WA (US); Christopher Andrew Schell, Tacoma, WA (US); Henry Yao, Santa Clara, CA (US); Raghu Ganesan, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/101,009

(22) Filed: Aug. 10, 2018

(65) Prior Publication Data
US 2019/0348989 A1 Nov. 14, 2019

Related U.S. Application Data

(60) Provisional application No. 62/670,945, filed on May 14, 2018.

(51) Int. Cl.
*H03L 7/099* (2006.01)
*H03L 7/083* (2006.01)
(Continued)

(52) U.S. Cl.
CPC .......... *H03L 7/0992* (2013.01); *G04F 10/005* (2013.01); *H03L 7/083* (2013.01);
(Continued)

(58) Field of Classification Search
None
See application file for complete search history.

(56) References Cited

U.S. PATENT DOCUMENTS 5,200,933 A 4/1993 Thornton et al.
5,304,954 A 4/1994 Saito et al.
(Continued)

FOREIGN PATENT DOCUMENTS

EP 0644657 3/1995
EP 3182592 6/2017
(Continued)

OTHER PUBLICATIONS

Michael H. Perrott. "Tutortial on Digital Phase-Locked Loops." CICC 2009. Sep. 2009.
(Continued)

*Primary Examiner* — Cassandra F Cox
(74) *Attorney, Agent, or Firm* — John R. Pessetto; Charles A. Brill; Frank D. Cimino

(57) ABSTRACT

A phase-locked loop circuit includes a first time-to-digital converter (TDC) to receive an input reference signal, a digital-controlled oscillator (DCO), and a first divider coupled to an output of the DCO. The first divider divides down a frequency of an output from the DCO. A second divider divides down a frequency of an output form the first divider to provide a second divider output to an input of the first TDC. The first TDC generates an output digital value encoding a time difference between corresponding edges of the input reference signal and the second divider output. A second TDC receives the input reference signal. An averager circuit generates a digital output that is indicative of an average of an output from the second TDC. A subtractor circuit subtracts the digital output from the average and the output digital value from the first TDC.

18 Claims, 3 Drawing Sheets

(51) Int. Cl.
*G04F 10/00* (2006.01)
*H03L 7/18* (2006.01)
*H03L 7/10* (2006.01)
*H03L 7/091* (2006.01)

(52) U.S. Cl.
CPC .............. *H03L 7/091* (2013.01); *H03L 7/10* (2013.01); *H03L 7/18* (2013.01)

(56) References Cited

U.S. PATENT DOCUMENTS

| | | | |
|---|---|---|---|
| 5,796,682 | A | 8/1998 | Swapp |
| 5,959,502 | A | 9/1999 | Ovens et al. |
| 6,308,055 | B1 | 10/2001 | Welland et al. |
| 6,310,653 | B1 | 10/2001 | Malcolm, Jr. et al. |
| 6,584,574 | B1 | 6/2003 | Embree |
| 6,597,249 | B2 | 7/2003 | Chien et al. |
| 7,126,429 | B2 | 10/2006 | Mitric |
| 7,755,439 | B2 | 7/2010 | Yu et al. |
| 7,876,136 | B2 | 1/2011 | Ha et al. |
| 8,179,174 | B2 | 5/2012 | Bunch |
| 8,368,438 | B2 | 2/2013 | Furuta |
| 8,957,711 | B2 | 2/2015 | Jin et al. |
| 9,020,089 | B2 | 4/2015 | Da Dalt |
| 9,490,820 | B2 | 11/2016 | Shiozaki |
| 9,634,826 | B1 | 4/2017 | Park et al. |
| 9,859,901 | B1 | 1/2018 | Chu et al. |
| 10,075,173 | B2 | 9/2018 | Sarda |
| 10,128,858 | B2 | 11/2018 | Goldberg et al. |
| 10,135,452 | B2 | 11/2018 | Cherniak et al. |
| 10,141,941 | B2 | 11/2018 | Petrov |
| 10,185,349 | B2 | 1/2019 | Musunuri et al. |
| 10,193,561 | B2 | 1/2019 | Lesso |
| 10,200,047 | B2 | 2/2019 | Markulic et al. |
| 10,291,214 | B2 | 5/2019 | Thijssen et al. |
| 2007/0085570 | A1 | 4/2007 | Matsuta |
| 2009/0015338 | A1 | 1/2009 | Frey |
| 2009/0219073 | A1* | 9/2009 | Sun ................... G04F 10/005 327/285 |
| 2009/0267664 | A1* | 10/2009 | Uozumi ................ H03K 5/135 327/158 |
| 2011/0234270 | A1* | 9/2011 | Kobayashi ............. H03L 7/07 327/156 |
| 2011/0273210 | A1 | 11/2011 | Nagaraj |
| 2012/0056769 | A1* | 3/2012 | Wang ................. G04F 10/005 341/166 |
| 2012/0161834 | A1 | 6/2012 | Lee et al. |
| 2013/0051290 | A1* | 2/2013 | Endo ................... H03K 23/662 370/281 |
| 2014/0225653 | A1 | 8/2014 | Hara et al. |
| 2014/0266351 | A1 | 9/2014 | Na et al. |
| 2014/0266354 | A1 | 9/2014 | Boo et al. |
| 2015/0077279 | A1 | 3/2015 | Song et al. |
| 2015/0188553 | A1 | 7/2015 | Familia et al. |
| 2015/0372690 | A1* | 12/2015 | Tertinek ................ H03L 7/085 327/156 |
| 2016/0056827 | A1* | 2/2016 | Vlachogiannakis ........ H03B 5/1265 327/158 |
| 2016/0156362 | A1 | 6/2016 | Kim et al. |
| 2016/0164532 | A1 | 6/2016 | Zhang et al. |
| 2016/0204787 | A1* | 7/2016 | Lotfy .................. H03L 7/085 327/142 |
| 2016/0238998 | A1 | 8/2016 | Pavlovic et al. |
| 2016/0352506 | A1 | 12/2016 | Huang |
| 2016/0380759 | A1* | 12/2016 | Kondo ................. H04L 7/0332 375/376 |
| 2017/0187383 | A1* | 6/2017 | Lesso ................. H03L 7/091 |
| 2017/0205772 | A1* | 7/2017 | Burg .................. H03L 7/091 |
| 2017/0288686 | A1* | 10/2017 | Gao ................... H03L 7/091 |
| 2018/0269885 | A1 | 9/2018 | Kondo et al. |
| 2018/0351558 | A1 | 12/2018 | Kuo et al. |

FOREIGN PATENT DOCUMENTS

| | | |
|---|---|---|
| JP | H11143570 | 5/1999 |
| JP | 2009260866 | 11/2009 |
| WO | 2015161890 | 10/2015 |

OTHER PUBLICATIONS

Texas Instruments Data Sheet LMK05028 Low-Jitter Dual-Channel Network Synchronizer Clock with EEPROM, Feb. 2018 (94 pages).
International Search Report in corresponding PCT Application No. PCT/US2019/021599 dated May 30, 2019 (2 pages).
International Search Report in corresponding PCT Application No. PCT/US2019/021968 dated Jun. 13, 2019 (2 pages).
International Search Report in corresponding PCT Application No. PCT/US2019/021966 dated Jun. 20, 2019 (2 pages).
International Search Report in corresponding PCT Application No. PCT/US2019/030892 dated Aug. 1, 2019 (3 pages).

* cited by examiner

is treated…

DIGITAL PHASE-LOCKED LOOP

CROSS-REFERENCE TO RELATED APPLICATIONS

The present application claims priority to U.S. Provisional Patent Application No. 62/670,945, filed May 14, 2018, titled "Pseudo Zero Delay Implementation in Digital Phase Locked Loop," which is hereby incorporated herein by reference in its entirety.

BACKGROUND

A phase-locked loop (PLL) is a circuit that generates an output periodic signal whose phase is related to the phase of input reference signal synchronizes the frequency of an output signal from the PLL to an input reference frequency using feedback. PLLs are used in a variety of applications such as to generate, stabilize, modulate, filter or recover a signal from a noise communications environment.

SUMMARY

In one example, a phase-locked loop circuit includes a first time-to-digital converter (TDC) to receive an input reference signal, a digital-controlled oscillator (DCO), and a first divider coupled to an output of the DCO. The first divider divides down a frequency of an output from the DCO. A second divider divides down a frequency of an output form the first divider to provide a second divider output to an input of the first TDC. The first TDC generates an output digital value encoding a time difference between corresponding edges of the input reference signal and the second divider output. A second TDC receives the input reference signal. An averager circuit generates a digital output that is indicative of an average of an output from the second TDC. A subtractor circuit subtracts the digital output from the averager from the output digital value from the first TDC.

BRIEF DESCRIPTION OF THE DRAWINGS

For a detailed description of various examples, reference will now be made to the accompanying drawings in which.

DETAILED DESCRIPTION

The disclosed examples pertain to a pseudo zero delay digital phase-locked loop (DPLL). The disclosed DPLL has, or is nearly, zero delay in that the phase of the DPLL's output signal is aligned with the phase of an input reference signal. Further, the disclosed DPLL includes a frequency divider in a feedback loop that is implemented as a fractional frequency divider. A fractional frequency divider generates an output signal with a frequency that is not integer fraction (e.g., not ½, not ⅓, etc.) of the frequency of its input signal. Instead, the frequency of the output signal from the fractional frequency divider is a non-integer fraction of the input frequency. The use of a fractional frequency divider helps to ensure satisfactory noise performance of a time-to-digital converter (TDC) that is also part of the DPLL. The disclosed DPLL bridges the contradictory preferences of using a fractional frequency divider to implement a pseudo delay DPLL where the output frequency is phase-aligned to the input reference signal.

The example of the DPLL described herein includes multiple frequency dividers including a post divider, a channel divider, and a feedback divider. The feedback divider is a fractional frequency divider. The post divider divides down the voltage-controlled oscillator's output frequency and provides a divided-down frequency to the fractional feedback divider as well as to the channel divider. The phase difference between the feedback divider's output clock and the input reference signal is determined using a TDC. The TDC uses the VCO's output clock as a sampling clock. As both the feedback clock (from the fractional feedback divider) and the channel divider's output clock are derived from the same post divider clock, a TDC resolution of the post divider clock is sufficient, and thus the output from the voltage controlled oscillator itself is not needed for the operation of the TDC.

Figure 1:
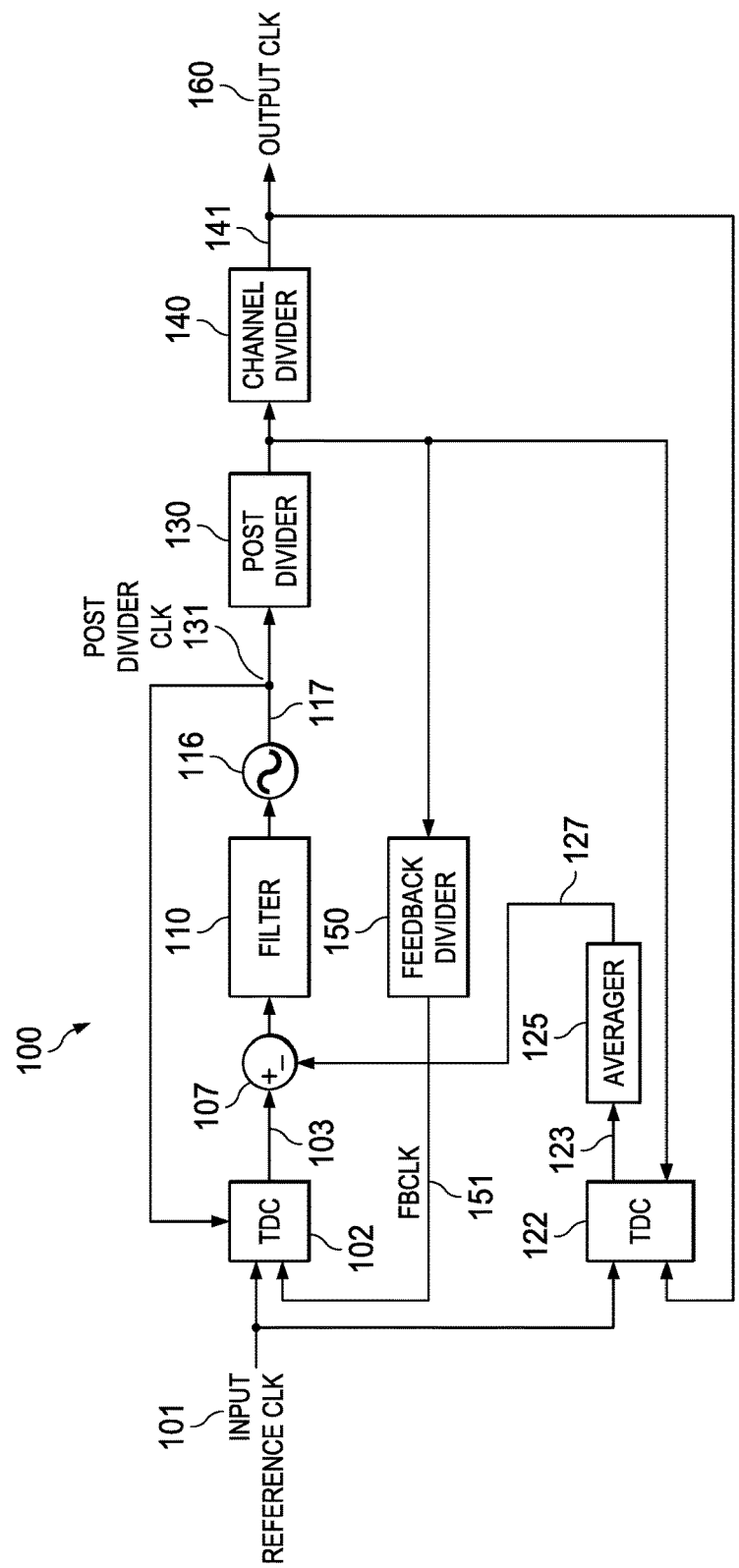
FIG. 1 illustrates a digital phase-locked loop in accordance with an example.

FIG. 1 shows an example of a DPLL 100. The example DPLL 100 includes TDCs 102 and 122, a subtraction circuit 107, a filter 110, a digitally-controlled oscillator (DCO) 116, a post divider 130, a channel divider 140, a feedback divider 150, and an averager circuit 125. An input reference clock 101 is provided to the DPLL 100 and the DPLL 100 generates an output signal 160. The input reference clock 101 is a periodic signal and the output clock 160 also is periodic and is of approximately the same frequency and phase as the input reference clock 101. In some examples, approximately refers to a first value that is equal to a second value or is within +1-10% of the second value.

The post divider 130 and the channel divider 140 are integer dividers meaning that there is an integer relationship between their input frequency and their output frequency. The feedback divider 150, however, is a fractional divider in this example. The frequency ratios implemented by the various frequency dividers are application specific.

In some examples, the DCO 116 is implemented as an analog PLL. In other examples, the DCO 116 is implemented a digital-to-analog converter (DAC) based voltage-controlled oscillator. The input reference clock 101 is provided to an input of TDC 102. The output clock 151 from the feedback divider 150 is designated as the feedback clock (FBCLK) and is provided to another input of TDC 102. TDC 102 is a counter-based circuit that generates a count value 103 that is indicative of the time between corresponding edges of the input reference signal 101 and FBCLK 151

The DCO clock 117 from the DCO 116 is provided to the post divider 130 which divides down the DCO clock 117 by an integer factor to produce a post divider clock 131. The post divider clock 131 is provided to both the channel divider 140 and to the feedback divider 150. The channel divider 140 divides down the post divider clock 131 to generate the output clock 160 according to an integer ratio. The feedback divider 150 divides down the post divider clock 131 to generate the output clock 160 according to a non-integer, fractional ratio to produce the FBCLK 151. The post divider clock 131 also is provided to TDC 122 as shown. As noted above, TDC 102 generates a count value 103 that is indicative of the time difference between corresponding edges of the input reference clock 101 and the FBCLK 151. TDC 122 generates a count value 123 that is indicative of the time difference between corresponding edges of the input reference clock 101 and the output clock 160. The averager circuit 125 receives multiple count values 123 from TDC 122 and computes an average count value. In some examples, the averager circuit 125 includes a summer that sums together N count values 123 and a divider to divide the sum by N. Averaging the count value helps to reduce the noise from the input reference clock 101. The averager circuit 125 produces an average count value 127 that is subtracted from count value 103 from TDC 102 by the subtraction circuit 107. The resulting difference from the subtraction circuit is then filtered by filter 110. Filter 110 is implemented as a digital filter in some examples. The output of filter 110 is then used to control the voltage produced by the DCO 116. The disclosed DPLL 100 advantageously enables a relatively highly accurate alignment of the output clock 160 to the input reference clock 101.

Figure 2:
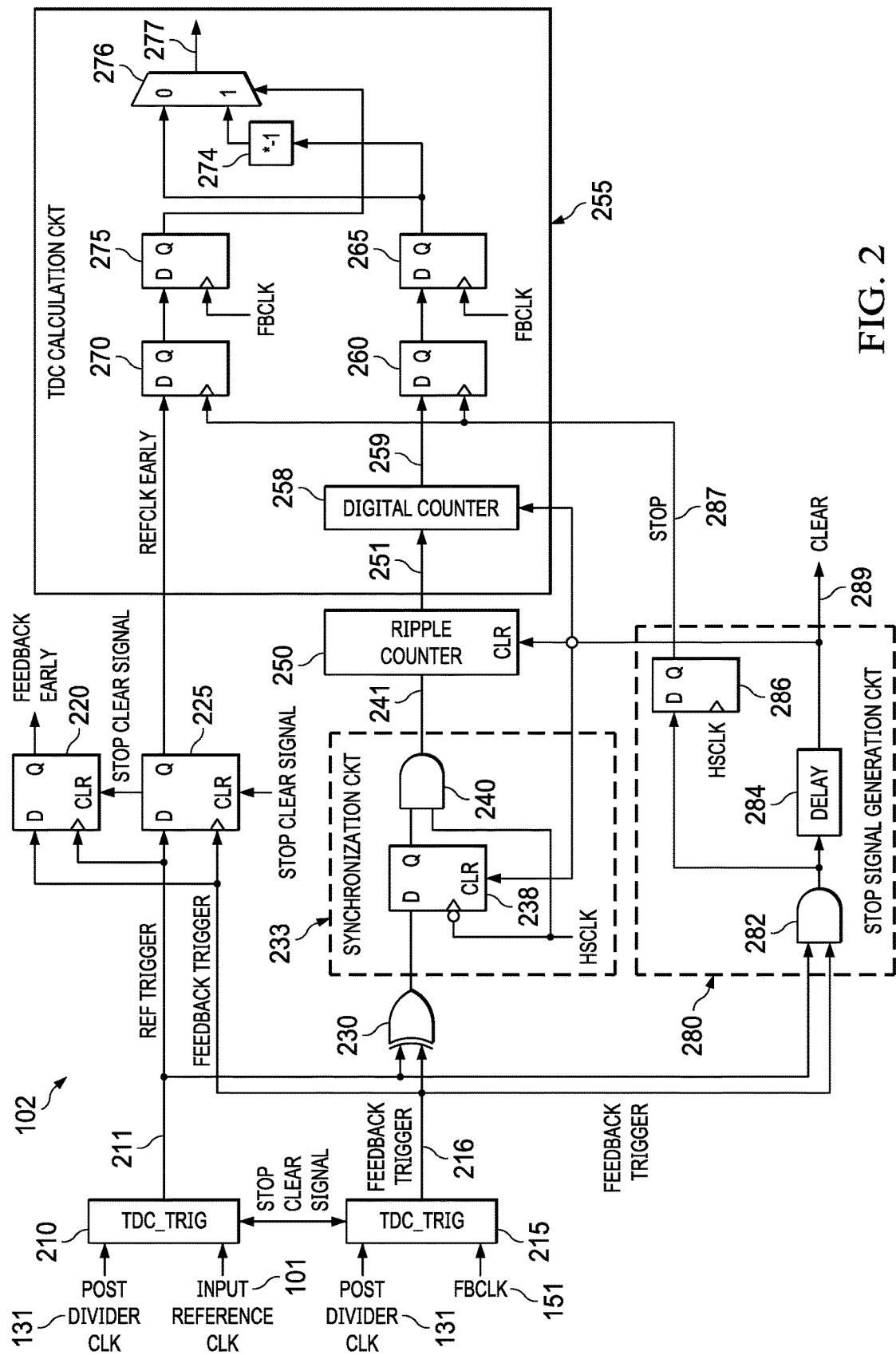
FIG. 2 shows an example of an implementation of a counter-based time-to-digital converter usable in the digital phase-locked loop of FIG. 1.

FIG. 2 shows an example of an implementation of TDC 102. The same circuit can be used to implement TDC 122. The TDC 102 includes TDC trigger circuits (TDC_TRIG) 210 and 215, flip-flops 220 and 225, logic gate 230, synchronization circuit 233, ripple counter 250, TDC calculation circuit 255, and stop signal generation circuit 280. The TDC circuit 102 determines the time difference between corresponding edges of the input reference clock 101 and FBCLK 151. For the implementation of TDC 122, the circuit is the same but the output clock 160 is used instead of FBCLK 151. Also the sampling clock for TDC 122 is the post divider clock instead of the VCO clock.

Referring still to FIG. 2, the input reference clock 101 is provided to an input of TDC trigger circuit 210 and FBCLK 151 is provided to an input of TDC trigger circuit 215. Another input of each of the TDC trigger circuits 210, 215 is the post divider clock 131 (sampling clock). Each trigger circuit 210, 215 synchronizes its input signal (the input reference clock 101 or FBCLK 151) to an edge of the post divider clock 131. The output signal 211 from the TDC trigger circuit 210 is designated as REF Trigger and transitions from low to high (or vice versa depending what is considered to be an active edge) when the input reference clock 101 is high when the post divider clock 131 transitions from low to high. That is, the input reference clock 101 transitioning from low to high causes a corresponding transition in REF Trigger upon the next active edge of the post divider clock 131. Similarly, the output signal 216 from the TDC trigger circuit 215 is designated as Feedback Trigger and transitions from low to high when FBCLK is high when the post divider clock 131 transitions from low to high. That is, FBCLK transitioning from low to high causes a corresponding transition in Feedback Trigger upon the next active edge of the post divider clock 131.

Logic gate 230 is shown in the example of FIG. 2 as being an exclusive-OR gate (and is referred to herein as exclusive-OR gate 230), but could be implemented as other logic gates or combinations of logic gates. The inputs of exclusive-OR gate 230 include the REF Trigger signal 211 and the Feedback Trigger signal 216. The output of the exclusive-OR gate 230 is provided to the synchronization circuit 233. The output of the exclusive-OR gate 230 is a logic high when one, but not both, of the REF Trigger and the Feedback Trigger signals 211 and 216 are logic high, that is, upon occurrence of the earliest rising edge of the input reference clock 101 or FBCLK 151.

The synchronization circuit 233 includes a D flip-flop 238 and an AND gate 240. The D flip-flop 238 includes a data input (D), a clock input and an output (Q). The output signal from the exclusive-OR gate 230 is provided to the D input of flip-flop 238. The post divider clock 131 is provided to the clock input of the D flip-flop and the output Q is coupled to an input of AND gate 240. The other input of AND gate 240 also receives post divider clock 131. When the first of the active edge of REF Trigger signal 211 or Feedback Trigger signal 216 is received, the output of the exclusive-OR gate 230 becomes a logic high. Upon the next active edge of post divider clock 131, the logic high on the D input of flip-flop 238 is latched through to the output Q of the flip-flop, and, with post divider clock 131 still being high causes the synchronization output signal 241 of the AND gate 240 to be high. The output of AND gate 240 represents the input to ripple counter 250.

In some examples, the ripple counter 250 is implemented as an asynchronous counter comprising multiple serially-connected flip-flops where an input flip-flop is clocked by an external clock, and each subsequent flip-flop is clocked by the output of the preceding flip-flop. The external clock that clocks the input flip-flop of ripple counter 250 is the synchronization output signal 241 from AND gate 240. The count output 251 of the ripple counter 250 is provided as an input to the TDC calculation circuit 255.

The TDC calculation circuit 255 includes digital counter 258, flip-flops 260, 265, 270, 275, two's complement circuit 274, and a multiplexer 276. The digital counter 258 counts active edges of the output 251 from the ripple counter 250 and provides an output count value 259. The combination of ripple counter 250 and digital counter 258 represents a counter circuit.

Referring still to the TDC example of FIG. 2, stop signal generation circuit 280 includes an AND gate 282, a delay element 284, and a D flip-flop 286. The inputs to AND gate 282 comprise the REF Trigger signal 211 and the Feedback Trigger signal 216 from the TDC trigger circuits 210 and 215, respectively. When both the REF Trigger signal 211 and the Feedback Trigger signal 216 are high, the output of AND gate 182 becomes a logic high. Both the REF Trigger signal 211 and the Feedback Trigger signal 216 being high represents the stop condition when the counting process should cease. The output of the AND gate 282 is latched into D flip-flop 286 upon occurrence of the next active edge of the post divider clock 131. The Q output of D flip-flop 286 represents the STOP signal 287 and is provided to the TDC calculation circuit 255 and used to clock flip-flops 260 and 270. Flip-flop 260 latches in the count value 259 from the digital counter 258 upon occurrence of an active edge of the STOP signal 287. The FBCLK signal is then used to latch the count output of flip-flop 260 by flip-flop 265 to thereby synchronize the count value to the FBCLK.

The delay element 284 delays the output of AND gate 182 to provide a CLEAR signal 289. The CLEAR signal 289 is essentially a delayed version of the STOP signal 287 with enough of a delay to ensure that the CLEAR signal 289 is asserted high at a time that that the count value from the digital counter 258 has been fully latched through flip-flops 260 and 270. The CLEAR signal 289 is provided to the clear inputs of the flip-flop 238, the ripple counter 250, the digital counter 258, and flip-flops 220 and 225. The CLEAR signal 289 resets these components in preparation for the generation of a new count value from the ripple and digital counters 250 and 258.

The active edge of FBCLK may come before or after the corresponding active edge of the input reference clock 101. The condition in which the active edge of the input reference clock 101 occurs before the active edge of FBCLK 151 represents a positive count value. The condition in which the input reference clock's active edge occurs after that of FBCLK represents a negative count value. Thus, the count value from the digital counter 258 may need to be modified to, for example, convert it to a negative count value if the active edge of FBCLK precedes that of the input reference clock 101. Flip-flops 220 and 225 are provided to determine whether the count value is to be converted to a negative value. Flip-flop 220 latches the Feedback Trigger signal 216 using REF Trigger 211 as a clock signal, and flip-flop 225 latches the REF Trigger signal 211 using Feedback Trigger 216 as a clock signal. The output of flip-flop 220 is designated as the Feedback Early signal and when asserted high indicates that the active edge of FBCLK 151 occurred before the corresponding active edge of the input reference clock 101. The output of flip-flop 225 is designated as the REF-CLK Early signal and when asserted high indicates that the active edge of the input reference clock 101 occurred before the corresponding active edge of FBCLK. In some examples, the Feedback Early output signal from flip-flop 220 is not used and in some examples, flip-flop 220 is not present. In some examples, however, the REFCLK Early signal from flip-flop 225 is latched into flip-flop 270 of the TDC calculation circuit 255 using the STOP signal 287 and the output of flip-flop 270 is latched into flip-flop 275 using FBCLK 151 to align the REFCLK Early signal to FBCLK.

The output of flip-flop 275 being asserted low indicates that active edge of the input reference clock 101 precedes that of FBCLK 151 and the output of flip-flop 275 being asserted high indicates that FBCLK's active edge precedes that of the input reference clock 101. The output of flip-flop 275 is used a control signal to control the selection of the inputs to multiplexer 276. One input of multiplexer 376 (the "0" input) is the latched count value from flip-flop 265. The other input to the multiplexer 276 (the "1" input) is the two's complement of the count value from flip-flop 265. The bits of the count value from the flip-flop 265 is converted to a two's complement form by two's complement circuit 274. In one example, the two's complement circuit 274 inverts each of the bits of the output count value from flip-flop 265 and then add 1 to least significant bit of that result.

Figure 3:
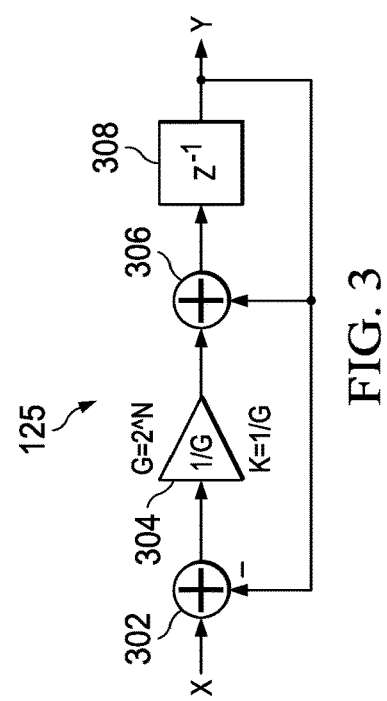
FIG. 3 shows an example of an averager circuit usable in the digital phase-locked loop of FIG. 1.

The output 277 from the multiplexer 276 represents the count value (either positive or negative) that encodes the time difference between corresponding edges of the input reference clock 101 and FBCLK 151, which is the count value 103 shown in FIG. 3. In some examples, TDC 102 in FIG. 1 is implemented using bipolar junction transistors (BJTs) and TDC 122 is implemented using metal oxide semiconductor field effect transistors (MOSFETs). In other examples, TDC 102 is implemented using MOSFETs and TDC 124 is implemented using BJTs. In yet other examples, TDC 102 and 122 are both implemented using the same type of transistors—either BJTs or MOSFETs.

FIG. 3 shows an example of the average circuit 125. In this example, the averager circuit 125 includes a subtractor 302, an amplifier 304, a summer 306, and a unit-sample delay 308. The gain of the amplifier 304 is less than 1 and thus functions as an attenuator. The subtractor 302 subtracts the output Y from the input X. The amplifier 304 produces an output that is 2^N times the output of the subtractor, where N represents a programmable attenuation value. The amplifier 304 will attenuate the output of the subtractor 302 by a programmable power (N) of 2. Thus the gain of the amplifier is K, where K=1/G and G=2^N. K is a divide operation. In some digital cases, a divide truncates the remainder fraction if it is not divisible into an integer number. In the disclosed examples, the fraction is maintained meaning that the output of the divider and summer will carry two values—one being the integer portion and the other being the fractional portion. The summer 306 adds the output of the amplifier 304 to Y and the unit-sample delay 308, which is implemented as a register, is used to store the sum of the current averaged output with the attenuated error. Overall, the transfer function implemented by the average circuit is:

$$\frac{Y}{X} = \frac{K*z^{-1}}{1+z^{-1}(K-1)}$$

If Y is to be the filtered averaged value of X, then the output of subtractor 302 is the error or difference between the input and output. The output of amplifier 304 will be the attenuated error. The attenuated error is added to the current output by summer 306 to generate a new output. For a constant input X, the output Y will slowly approach X based on the programmable attenuation. If noise is present on X, the output Y will be the average of X or a filtered average of X.

Figure 5:
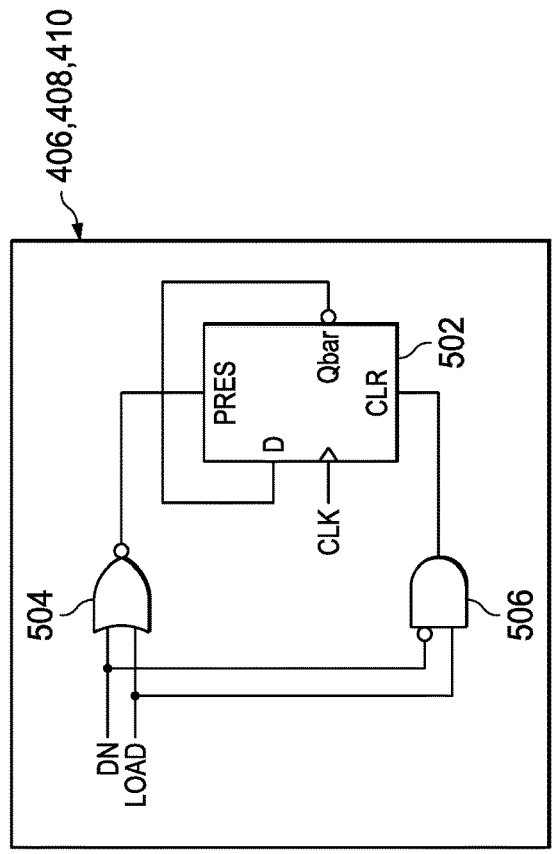
FIG. 5 shows an example of an architecture for a flip-flop usable in the frequency divider of FIG. 4.
Figure 4:
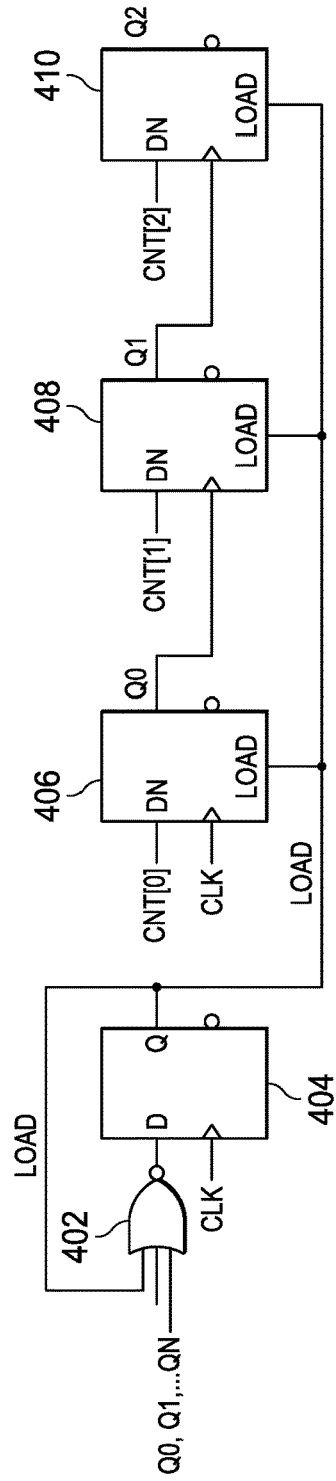
FIG. 4 shows an example of frequency divider usable in the digital phase-locked loop of FIG. 1.

FIG. 4 shows an example of a frequency divider usable to implement the feedback divider 150, post divider 130, or the channel divider 140. The frequency divider in the example of FIG. 4 is a ripple counter that comprises NOR gate 402 and flip-flops 404, 406, 408, and 410. The Q0 output of flip-flop 406 is connected to the D input of the next flip-flop 408 in the chain, and the Q1 output of flip-flop 408 is connected to the clock input of flip-flop 410. The clock input (CLK) of flip-flops 404 and 406 is the input clock whose frequency is being divided down. The NOR gate 402 receives as inputs the Q outputs of the flip-flops 406-410. Although three flip-flops 406-410 are shown in the example of FIG. 5, a different number of flip-flops can be provided in other examples. The NOR gate 402 determines the terminal count for the ripple counter. The ripple counter is configured as a down counter in this example. When the count reaches 0, the counter is then reloaded. The Load signal includes a registered terminal count, which will only be high for 1 count as the load feeds back into the NOR gate 402 to remove the terminal count. In addition, the Load performs an asynchronous PRESET/CLR to each of the Q1-QN flip-flops based on the counter value which will force the counter to no longer be zero or the terminal count. Flip-flops 406-410 act as a synchronous toggle with an asynchronous load, with the Load signal being programmable based on the counter value. CNT[2], CNT[1], and CNT[0] are the programmable counter value. This counter in this example is a 3-bit counter, but can be increased to N number of bits in general, where N is at least 1.

Any of flip-flops 406-410 can be implemented as shown in FIG. 5. In FIG. 5, each flip-flop 406-410 comprises of a standard flip-flop 502 with a clear (CLR) and preset (PRES) as well as a NOR gate 504 and AND gate 506 used to form the asynchronous load. The inputs to the NOR gate 504 are the DN count input and the Load signal. The output of NOR gate 504 is coupled to the preset input of the flip-flop 502. The inputs to AND gate 506 also are the DN and Load signals (with DN being inverted) and the output of the AND gate clears the flip-flop 502. The Qbar output of flip-flop 502 also feeds back into its D input to form the toggle function, where the output will toggle between 1 and 0 on every clock input.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A phase-locked loop circuit, comprising:
a first time-to-digital converter (TDC) coupled to receive an input reference signal;
a digital-controlled oscillator (DCO) coupled to the first TDC;
a first divider coupled to an output of the DCO, the first divider to divide down a frequency of an output signal from the DCO;
a second divider coupled to an output of the first divider, the second divider to divide down a frequency of an output signal from the first divider to provide a second divider output signal to an input of the first TDC for the first TDC to generate an output digital value encoding a time difference between corresponding edges of the input reference signal and the second divider output signal;
a second TDC coupled to receive the input reference signal;
an averager circuit to generate a digital output that is indicative of an average of an output signal from the second TDC; and
a subtractor circuit to subtract the digital output from the averager and the output digital value from the first TDC to provide a subtraction output.

2. The phase-locked loop circuit of claim 1, further comprising a third divider coupled to the output of the first divider, the third divider to divide down the frequency of the output signal from the first divider.

3. The phase-locked loop circuit of claim 2, wherein the second TDC is coupled to receive an output signal from the third divider and to generate the output signal to the average circuit that is a digital value that is indicative of a time difference between corresponding edges of the input reference signal and the output signal from the third divider.

4. The phase-locked loop circuit of claim 2, wherein the first and third dividers are integer dividers and the second divider is a fractional divider.

5. The phase-locked loop circuit of claim 1, wherein the first TDC includes a counter.

6. The phase-locked loop circuit of claim 1, wherein the second TDC includes a counter.

7. The phase-locked loop circuit of claim 1, further comprising a third divider coupled to the output of the first divider, the third divider to divide down the frequency of the output signal from the first divider, each of the first and second TDCs includes a counter, and each of the counters counts edges of the output of the first divider.

8. A phase-locked loop circuit, comprising:
a first time-to-digital converter (TDC) coupled to receive an input reference signal;
a digital-controlled oscillator (DCO) coupled to the first TDC;
a first divider coupled to an output of the DCO, the first divider to divide down a frequency of an output signal from the DCO;
a second divider coupled to an output of the first divider, the second divider to divide down a frequency of an output signal from the first divider to provide a second divider output signal to an input of the first TDC for the first TDC to generate an output digital value encoding a time difference between corresponding edges of the input reference signal and the second divider output signal;
a third divider coupled to an output of the first divider, the third divider to divide down a frequency of the output signal from the first divider to provide a third divider output signal to help control the DCO; and
further comprising a second TDC coupled to receive the input reference signal and to receive the third divider output signal and to generate an output signal that is a digital value that is indicative of a time difference between corresponding edges of the input reference signal and the third divider output signal.

9. The phase-locked loop circuit of claim 8, further comprising an averager circuit to generate a digital output that is indicative of an average of the output signal from the second TDC.

10. The phase-locked loop circuit of claim 9, further comprising a subtractor circuit coupled between the first TDC and the DCO, the subtractor circuit subtracting the averager circuit's digital output from an output from the first TDC.

11. The phase-locked loop circuit of claim 10, wherein:
the first and third dividers are integer dividers and the second divider is a fractional divider;
the first TDC includes a first counter to count pulses of the output signal from the first divider between corresponding edges of the input reference signal and the second divider output signal; and
the second TDC includes a second counter to count pulses of the output signal from the first divider between corresponding edges of the input reference signal and the third divider output signal.

12. A phase-locked loop circuit, comprising:
a first time-to-digital converter (TDC) coupled to receive an input reference signal;
a digital-controlled oscillator (DCO) coupled to the first TDC;
a first divider coupled to an output of the DCO, the first divider to divide down a frequency of an output signal from the DCO;
a second divider coupled to an output of the first divider, the second divider to divide down a frequency of an output signal from the first divider to provide a second divider output signal to an input of the first TDC for the first TDC to generate an output digital value encoding a time difference between corresponding edges of the input reference signal and the second divider output signal;
a third divider coupled to an output of the first divider, the third divider to divide down a frequency of the output signal from the first divider to provide a third divider output signal to help control the DCO; and
wherein the first and third dividers are integer dividers and the second divider is a fractional divider.

13. A phase-locked loop circuit, comprising:
a first time-to-digital converter (TDC) coupled to receive an input reference signal;
a digital-controlled oscillator (DCO) coupled to the first TDC;
a first divider coupled to an output of the DCO, the first divider to divide down a frequency of an output signal from the DCO;
a second divider coupled to an output of the first divider, the second divider to divide down a frequency of an output signal from the first divider to provide a second divider output signal to an input of the first TDC for the first TDC to generate an output digital value encoding a time difference between corresponding edges of the input reference signal and the second divider output signal;

a third divider coupled to an output of the first divider, the third divider to divide down a frequency of the output signal from the first divider to provide a third divider output signal to help control the DCO; and a subtractor circuit to subtract a second signal indicative of a time difference between corresponding edges of the input reference signal and an output signal from the phase-locked loop circuit from an output of the first TDC.

14. The phase-locked loop circuit of claim 13, further comprising a second TDC coupled to receive the input reference signal and the output signal from the phase-locked loop circuit and to generate a second TDC output signal that encodes the time difference between corresponding edges of the input reference signal and an output signal from the phase-locked loop circuit.

15. The phase-locked loop circuit of claim 13, wherein the first TDC includes a first counter and the second TDC includes a second counter, wherein each of the first and second counter uses an output signal from the first divider.

16. The phase-locked loop circuit of claim 13, further comprising an averager circuit to receive multiple signals indicative of the time difference between the corresponding edges of the input reference signal and an output signal from the phase-locked loop circuit and to generate the second signal as an average of the multiple signals.

17. The phase-locked loop circuit of claim 13, wherein the first divider is an integer divider and the second divider is a fractional divider.

18. The phase-locked loop circuit of claim 17, wherein the third divider is an integer divider.

* * * * *